United States Patent
Ishibashi

(10) Patent No.: US 10,737,301 B2
(45) Date of Patent: Aug. 11, 2020

(54) SUBSTRATE CLEANING APPARATUS

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 478 days.

(21) Appl. No.: 14/139,685

(22) Filed: Dec. 23, 2013

(65) Prior Publication Data
US 2014/0182634 A1 Jul. 3, 2014

(30) Foreign Application Priority Data
Dec. 28, 2012 (JP) ................. 2012-287122

(51) Int. Cl.
*B08B 3/02* (2006.01)
*H01L 21/67* (2006.01)
*B08B 5/02* (2006.01)

(52) U.S. Cl.
CPC ........ *B08B 3/024* (2013.01); *H01L 21/67051* (2013.01); *B08B 5/02* (2013.01)

(58) Field of Classification Search
CPC .......................... B08B 3/024; H01L 21/67051
See application file for complete search history.

(56) References Cited

U.S. PATENT DOCUMENTS

| | | | | |
|---|---|---|---|---|
| 5,372,652 A * | 12/1994 | Srikrishnan | ........... | B08B 7/0092 134/21 |
| 6,558,478 B1 * | 5/2003 | Katakabe | .......... | H01L 21/67051 134/2 |
| 6,942,737 B2 * | 9/2005 | Sato | .......... | B08B 1/04 134/33 |
| 7,267,130 B2 * | 9/2007 | Okuda | ...... | B08B 1/04 134/103.2 |
| 7,527,698 B2 * | 5/2009 | Holsteyns | ......... | H01L 21/02052 134/100.1 |

(Continued)

FOREIGN PATENT DOCUMENTS

| | | |
|---|---|---|
| JP | 10-308374 A | 11/1998 |
| JP | 3504023 | 12/2003 |

(Continued)

OTHER PUBLICATIONS

JP2004335671—Machine Translation (Year: 2004).*
JP2013162040—Machine Translation (Year: 2013).*

*Primary Examiner* — Marc Lorenzi
(74) *Attorney, Agent, or Firm* — BakerHostetler

(57) ABSTRACT

A substrate cleaning apparatus cleans a surface of a substrate in a non-contact state. The substrate cleaning apparatus includes a substrate holding mechanism configured to hold and rotate the substrate, a two-fluid nozzle configured to jet a two-fluid jet flow, comprising a gas and a liquid, downwardly toward the front surface of the substrate held by the substrate holding mechanism, and a moving mechanism configured to move the two-fluid nozzle in one direction from a central portion toward a radially outer side of the substrate held by the substrate holding mechanism. The two-fluid nozzle is inclined so that an angle between an ejection center line of the two-fluid jet flow jetted from the two-fluid nozzle and a vertical line becomes a certain inclined angle, and the two-fluid jet flow collides with the front surface of the substrate at a forward position in a moving direction of the two-fluid nozzle.

11 Claims, 15 Drawing Sheets

(56) References Cited

U.S. PATENT DOCUMENTS

| | | | |
|---|---|---|---|
| 8,186,297 B2 * | 5/2012 | Park | H01L 21/6715 118/313 |
| 2001/0042559 A1 * | 11/2001 | Mertens | G03F 7/423 134/31 |
| 2002/0148916 A1 * | 10/2002 | Wong | H01L 21/67028 239/587.1 |
| 2004/0115567 A1 * | 6/2004 | Mandel | B05C 5/027 430/324 |
| 2005/0223980 A1 * | 10/2005 | Awamura | G03F 7/30 118/708 |
| 2006/0068093 A1 * | 3/2006 | Shite | G03F 7/162 427/240 |
| 2007/0006904 A1 * | 1/2007 | Hagiwara | B08B 3/02 134/198 |
| 2007/0044823 A1 * | 3/2007 | Yamamoto | H01L 21/67051 134/33 |
| 2011/0289795 A1 * | 12/2011 | Ishibashi | H01L 21/02074 34/467 |
| 2012/0260952 A1 * | 10/2012 | Nonaka | H01L 21/02052 134/30 |
| 2013/0023186 A1 * | 1/2013 | Motoshima | B24B 55/02 451/7 |
| 2014/0154890 A1 * | 6/2014 | Hatakeyanna | H01L 21/6715 438/778 |

FOREIGN PATENT DOCUMENTS

| | | | |
|---|---|---|---|
| JP | 2004-079767 A | | 3/2004 |
| JP | 2004335671 A | * | 11/2004 |
| JP | 2005-353739 A | | 12/2005 |
| JP | 2010-238850 | | 10/2010 |
| JP | 2012-174933 A | | 9/2012 |
| JP | 2013-089797 A | | 5/2013 |
| JP | 2013162040 A | * | 8/2013 |
| KR | 2003-0036087 A | | 5/2003 |
| KR | 2007-0043080 A | | 4/2007 |
| TW | 379147 | | 1/2000 |
| TW | 200952110 A1 | | 12/2009 |

* cited by examiner

CLEANED AREA | AREA TO BE CLEANED

SUBSTRATE CLEANING APPARATUS

CROSS REFERENCE TO RELATED APPLICATION

This document claims priority to Japanese Patent Application No. 2012-287122 filed Dec. 28, 2012, the entire contents of which are hereby incorporated by reference.

BACKGROUND OF THE INVENTION

Field of the Invention

The present invention relates to a substrate cleaning apparatus, and more particularly to a substrate cleaning apparatus for cleaning a surface (polished surface) of a substrate such as a semiconductor wafer in a non-contact state by using two-fluid jet cleaning. The substrate cleaning apparatus of the present invention can deal with a semiconductor wafer having a large diameter of 450 mm, and can be applied to a manufacturing process of a flat panel, a manufacturing process of an image sensor such as CMOS and CCD, a manufacturing process of a magnetic film for MRAM, and the like.

Description of the Related Art

As semiconductor devices are becoming finer these days, cleaning of various films, made of materials having different physical properties and formed on a substrate, is widely practiced. For example, in a damascene interconnect forming process for forming interconnects by filling a metal into interconnect trenches formed in an insulating film on the substrate surface, an extra metal on the substrate surface is polished away by chemical mechanical polishing (CMP) after the formation of damascene interconnects. A plurality of films such as a metal film, a barrier film and an insulating film, having different wettabilities with water, are exposed on the substrate surface after CMP.

Particles (defects) such as a residue of a slurry (slurry residue) that has been used in CMP, and metal polishing debris exist on the substrate surface having the exposed films, such as a metal film, a barrier film and an insulating film, by CMP. If cleaning of the substrate surface is insufficient and the residues remain on the substrate surface, the residues on the substrate surface may cause reliability problems such as the occurrence of leak from a residue portion, and poor adhesion. It is therefore necessary to clean the substrate surface, with high cleanliness, on which the plurality of films, such as a metal film, a barrier film and an insulating film, having different wettabilities with water are exposed.

As one of cleaning methods for cleaning a surface of a substrate such as a semiconductor wafer in a non-contact state, there has been known two-fluid jet cleaning which uses a two-fluid jet (2FJ), as disclosed in Japanese patent No. 3504023 and Japanese laid-open patent publication No. 2010-238850. The two-fluid jet cleaning is performed as follows: As shown in FIG. 1, a two-fluid nozzle 100 is arranged in the vertical direction, with its front end facing downward, above a substrate W which is horizontally rotating in the rotational direction R with its front surface (polished surface) facing upward, and a two-fluid jet flow comprising mist (fine liquid droplets) carried on a high-speed gas flow is ejected downwardly toward the surface of the substrate W from the two-fluid nozzle 100 to collide with the surface of the substrate W while the two-fluid nozzle 100 is moved in one direction parallel to the surface of the substrate W and along a moving direction M which is directed from a central portion to an outer portion of the substrate along a radius of the substrate W. Thus, particles on the surface of the substrate W are removed (cleaned) by utilizing shock waves generated by the collision of the fine liquid droplets with the surface of the substrate W.

However, in the conventional two-fluid jet cleaning, particles which have been removed and mist (fine liquid droplets) floating in the air are liable to be attached onto the surface of the substrate especially when the substrate has a surface having a hydrophobic property and such surface is cleaned, and thus it is difficult to clean the entire area of the surface of the substrate with high cleanliness. Specifically, as shown in FIGS. 2 and 3, when the mist carried on the high-speed gas flow is jetted downwardly in a vertical direction toward the surface of the substrate W, which is rotating horizontally, from the two-fluid nozzle 100 to collide with the surface of the substrate W, the mist spreads substantially equally therearound after the collision with the surface of the substrate W and scatters in the space, and is then attached onto the surface of the substrate W. Further, as shown in FIG. 4, the particles 102 which have been stirred up from the surface of the substrate by the collision of the mist, ride on a gas flow which spreads substantially equally therearound after the collision with the surface of the substrate W and float, and then fly down on the cleaned area of the surface of the substrate W and attach thereto. Particularly, in the case of the hydrophobic surface, the mist and the particles which have been attached on the cleaned area are liable to be stagnated thereon, and thus the particles remain on the surface of the substrate W and become defects.

Further, a size of a silicon wafer is becoming larger from a maximum diameter of 300 mm to a maximum diameter of 450 mm, and thus it is expected to become more difficult to clean a substantially entire area of the surface of the substrate such as a silicon wafer having a diameter of 450 mm with high cleanliness.

SUMMARY OF THE INVENTION

The present invention has been made in view of the above. It is therefore an object of the present invention to provide a substrate cleaning apparatus which can clean a surface of a substrate with high cleanliness by effectively utilizing inherent cleaning characteristics of a two-fluid jet cleaning.

According to one aspect of the present invention, there is provided a substrate cleaning apparatus for cleaning a substrate having a front surface and a reverse surface, the substrate cleaning apparatus comprising: a substrate holding mechanism configured to hold and rotate the substrate, with the front surface facing upward; a two-fluid nozzle configured to jet a two-fluid jet flow, comprising a gas and a liquid, downwardly toward the front surface of the substrate held by the substrate holding mechanism; and a moving mechanism configured to move the two-fluid nozzle in one direction from a central portion toward a radially outer side of the substrate held by the substrate holding mechanism; wherein the two-fluid nozzle is arranged to be inclined so that an angle between an ejection center line of the two-fluid jet flow jetted from the two-fluid nozzle and a vertical line becomes an inclined angle α, and the two-fluid jet flow collides with the front surface of the substrate at a forward position in a moving direction of the two-fluid nozzle.

According to the present invention, the two-fluid jet flow which has been jetted from the ejection port of the two-fluid nozzle and has collided with the surface of the substrate and splashed back, mostly flows toward the radially outer side of the substrate along the moving direction of the two-fluid nozzle. Therefore, mist and particles contained in the two-fluid jet flow can be inhibited to be reattached onto an area, which has been cleaned, of the surface of the substrate, and thus two-fluid jet cleaning which has the inherent cleaning characteristics can be performed.

In a preferred aspect of the present invention, the inclined angle α is larger than 0° and not more than 45° (0°<α≤45°). The inclined angle α is preferably not less than 5° and not more than 45° (5°≤α≤45°).

In a preferred aspect of the present invention, the two-fluid nozzle is arranged so that a line formed by vertically projecting the ejection center line of the two-fluid jet flow, jetted from the two-fluid nozzle, onto the substrate intersects with a line formed by vertically projecting a straight line, extending in the moving direction of the two-fluid nozzle, onto the substrate at an angle β, and the two-fluid jet flow collides with the surface of the substrate at an upstream side of a rotational direction of the substrate with respect to the straight line extending in the moving direction of the two-fluid nozzle.

According to the present invention, the two-fluid jet flow jetted from the ejection port collides with the surface of the substrate at the upstream side of the rotational direction of the substrate with respect to the straight line extending in the moving direction of the two-fluid nozzle. With this configuration, a relative velocity between the rotating substrate and the two-fluid jet flow when the two-fluid jet flow collides with the surface of the substrate can be increased, and thus an impact force of the two-fluid jet flow applied to the surface of the substrate can be increased to obtain enhanced cleaning characteristics.

In a preferred aspect of the present invention, the angle β is larger than 0° and not more than 30°. The angle β is preferably not less than 5° and not more than 30° (5°≤β≤30°).

In a preferred aspect of the present invention, the two-fluid nozzle has an ejection port having an elongated rectangular shape.

According to the present invention, a cleaning duration per a unit area of the surface of the substrate can be prolonged and the entire surface including the outer peripheral portion of the substrate can be cleaned more reliably while securing a large cleaning area, by a simple structure.

In a preferred aspect of the present invention, the substrate cleaning apparatus further comprising: a scatter-preventive cup configured to surround a periphery of the substrate held by the substrate holding mechanism; wherein the scatter-preventive cup has a centralized exhaust port, having a widened opening portion, at a forward position in the moving direction of the two-fluid nozzle.

According to the present invention, the two-fluid jet flow, which has collided with the surface of the substrate and splashed back and then flows toward the radially outer side of the substrate along the moving direction of the two-fluid nozzle, can be rapidly collected into the interior of the scatter-preventive cup through the centralized exhaust port.

In a preferred aspect of the present invention, the centralized exhaust port is connected to an exclusive exhaust duct.

According to the present invention, a larger volume of the two-fluid jet flow can be exhausted from the centralized exhaust port through the exclusive exhaust duct to the outside.

According to the present invention, the two-fluid jet flow which has been jetted from the two-fluid nozzle and has collided with the surface of the substrate and splashed back, can mostly flow toward the radially outer side of the substrate along the moving direction of the two-fluid nozzle. Therefore, the mist and the particles contained in the two-fluid jet flow can be inhibited to be reattached onto an area, which has been cleaned, of the surface of the substrate, and thus the two-fluid jet cleaning which has the inherent cleaning characteristics can be performed.

DETAILED DESCRIPTION

Figure 1:
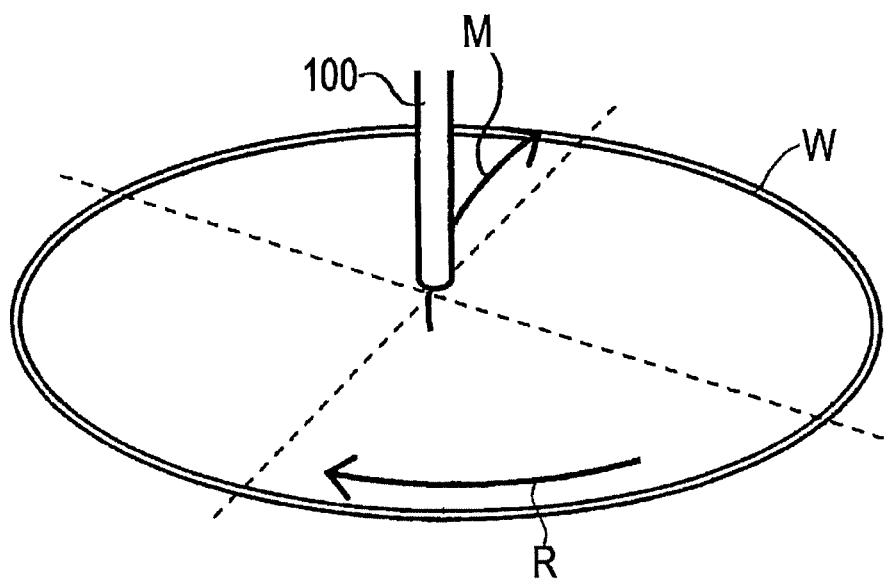
FIG. 1 is a perspective view showing the relationship between a substrate and a two-fluid nozzle in a conventional two-fluid jet cleaning.
Figure 2:
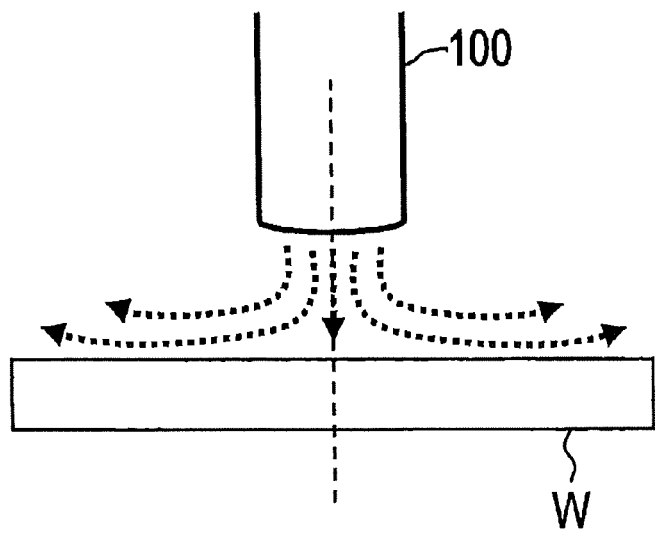
FIG. 2 is an elevational view of FIG. 1.
Figure 3:
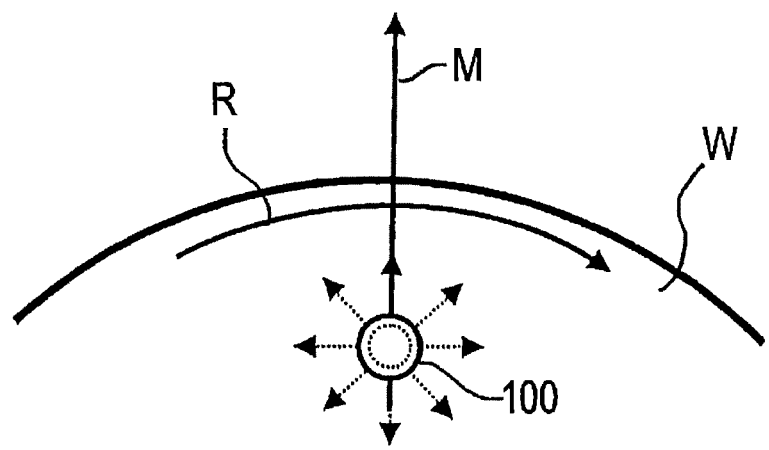
FIG. 3 is an enlarged plan view showing a part of FIG. 1.
Figure 4:
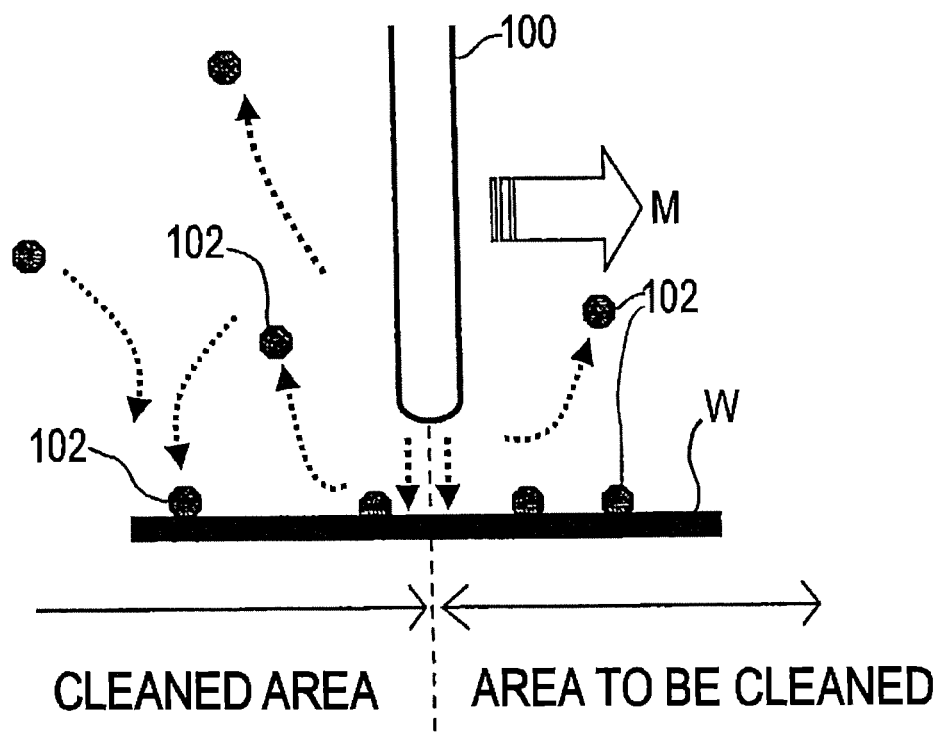
FIG. 4 is a view for explanation of particle behavior in the conventional two-fluid jet cleaning.

A substrate cleaning apparatus according to embodiments of the present invention will be described below with reference to FIGS. 5 through 20. Like or corresponding structural elements are denoted by like or corresponding reference numerals in FIGS. 5 through 20 and will not be described below repetitively.

Figure 5:
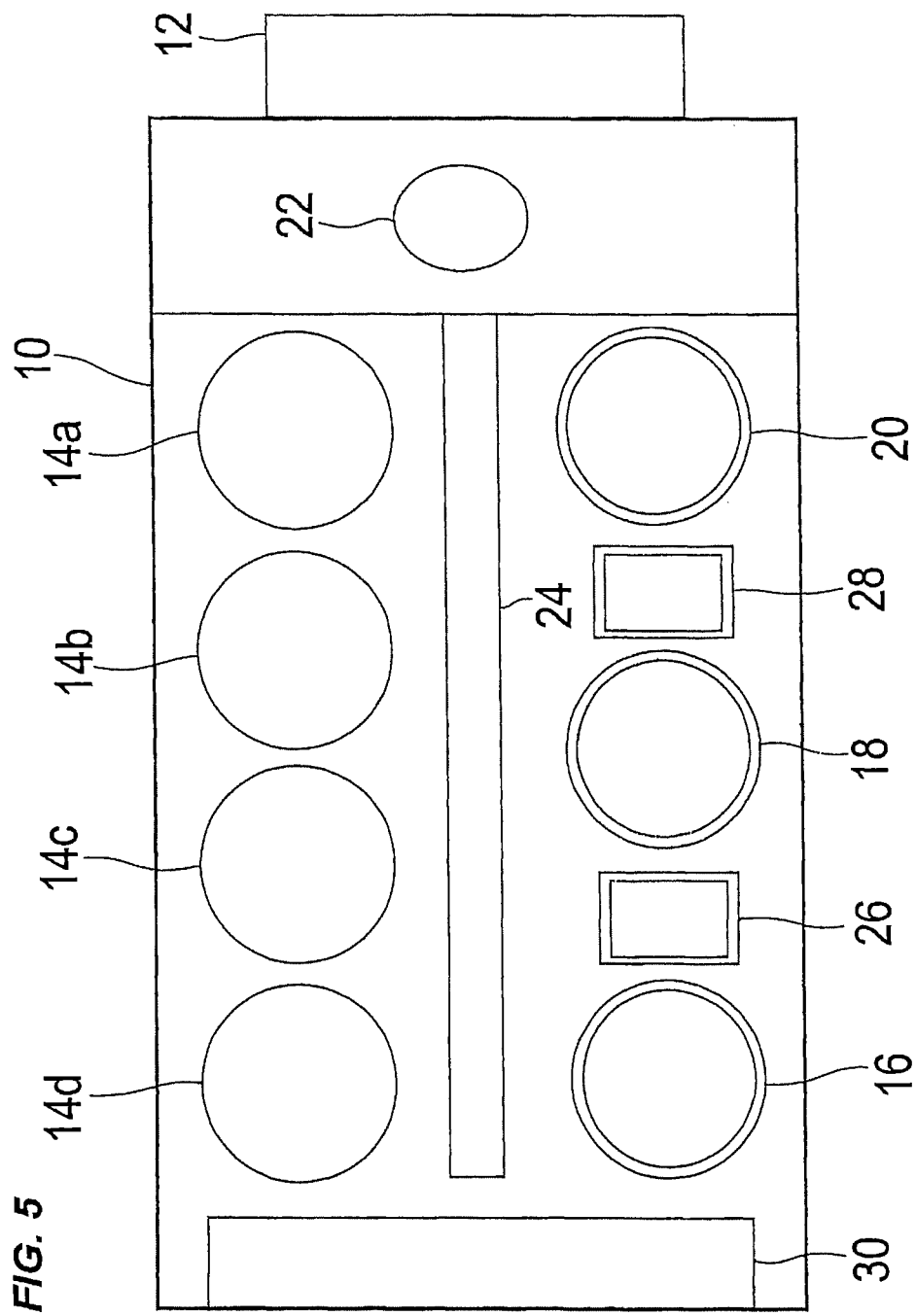
FIG. 5 is a plan view showing an entire structure of a substrate processing apparatus incorporating a substrate cleaning apparatus according to an embodiment of the present invention.

FIG. 5 is a plan view showing an entire structure of a substrate processing apparatus incorporating a substrate cleaning apparatus according to an embodiment of the present invention. As shown in FIG. 5, the substrate processing apparatus includes a generally-rectangular housing 10, and a loading port 12 for placing thereon a substrate cassette storing a large number of substrates, such as semiconductor wafers. The loading port 12 is disposed adjacent to the housing 10 and is capable of placing thereon an open cassette, a SMIF (standard manufacturing interface) pod or a FOUP (front opening unified pod). Each of the SMIF and the FOUP is a hermetically sealed container which houses therein a substrate cassette and is covered with a partition wall, and thus can keep independent internal environment isolated from an external space.

In the housing 10, there are provided a plurality of (four in this embodiment) polishing units 14a, 14b, 14c, 14d, a first cleaning unit 16 and a second cleaning unit 18 each for cleaning a substrate after polishing, and a drying unit 20 for drying a substrate after cleaning. The polishing units 14a, 14b, 14c, 14d are arranged in the longitudinal direction of the substrate processing apparatus, and the cleaning units 16, 18 and the drying unit 20 are also arranged in the longitudinal direction of the substrate processing apparatus. In this example, the substrate cleaning apparatus according to the embodiment of the present invention is applied to the second cleaning unit 18.

A first transfer robot 22 is disposed in an area surrounded by the loading port 12, and the polishing unit 14a and the drying unit 20 which are located near the loading port 12. Further, a substrate transport unit 24 is disposed in parallel to the polishing units 14a, 14b, 14c, 14d. The first transfer robot 22 receives a substrate before polishing from the loading port 12 and transfers the substrate to the transport unit 24, and receives a substrate after drying from the drying unit 20 and returns the substrate to the loading port 12. The transport unit 24 transports a substrate transferred from the first transfer robot 22, and transfers the substrate between the transport unit 24 and the polishing units 14a, 14b, 14c, 14d and transfers a substrate transferred from the polishing units 14a, 14b, 14c, 14d to the first cleaning unit 16.

Between the first cleaning unit 16 and the second cleaning unit 18, there is provided a second transfer robot 26 for transferring a substrate between the first cleaning unit 16 and the second cleaning unit 18. Between the second cleaning unit 18 and the drying unit 20, there is provided a third transfer robot 28 for transferring a substrate between the second cleaning unit 18 and the drying unit 20. In the housing 10, there is provided a control panel 30 for controlling operations of respective devices in the substrate processing apparatus.

In this example, a roll cleaning unit in which elongated cylindrical roll cleaning members extending horizontally are brought into contact with the front surface and the reverse surface of the substrate in the presence of a cleaning liquid and the substrate and the roll cleaning members are being rotated in respective directions to scrub-clean the front surface and the reverse surface of the substrate, is used as the first cleaning unit 16. The first cleaning unit (roll cleaning unit) 16 is configured to use a megasonic cleaning in which an ultrasonic wave is applied at a frequency of several dozen Hz to about 1 MHz to the cleaning liquid to vibrate the cleaning liquid and to apply a force generated due to the vibrational acceleration of the cleaning liquid to fine particles deposited on the surfaces of the substrate, in combination with the scrub cleaning.

In this example, the substrate cleaning apparatus according to the embodiment of the present invention is used as the second cleaning unit 18. Further, a spin drying unit in which an IPA gas is ejected toward a substrate rotating horizontally from a moving injection nozzle to dry the substrate and the substrate is rotated at a high rotational speed to dry the substrate by a centrifugal force, is used as the drying unit 20.

Figure 6:
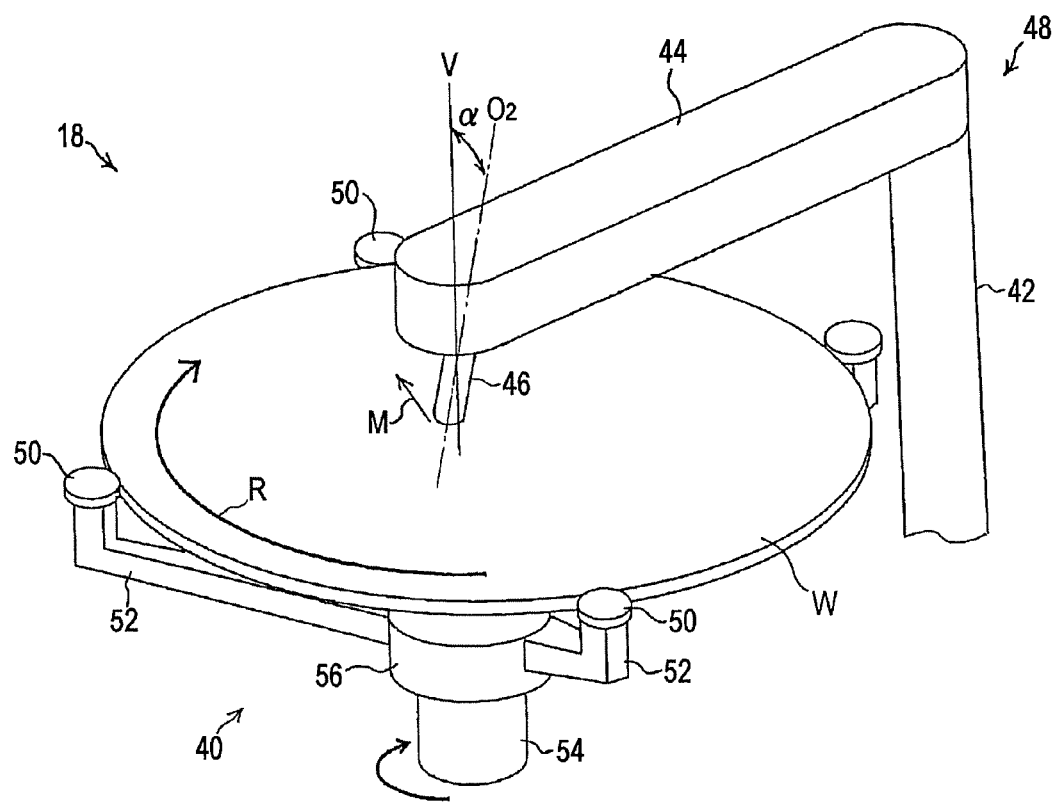
FIG. 6 is a schematic perspective view showing the substrate cleaning apparatus, according to an embodiment of the present invention, which is used as a second cleaning unit shown in FIG. 5, illustration of a scatter-preventive cup being omitted.
Figure 7:
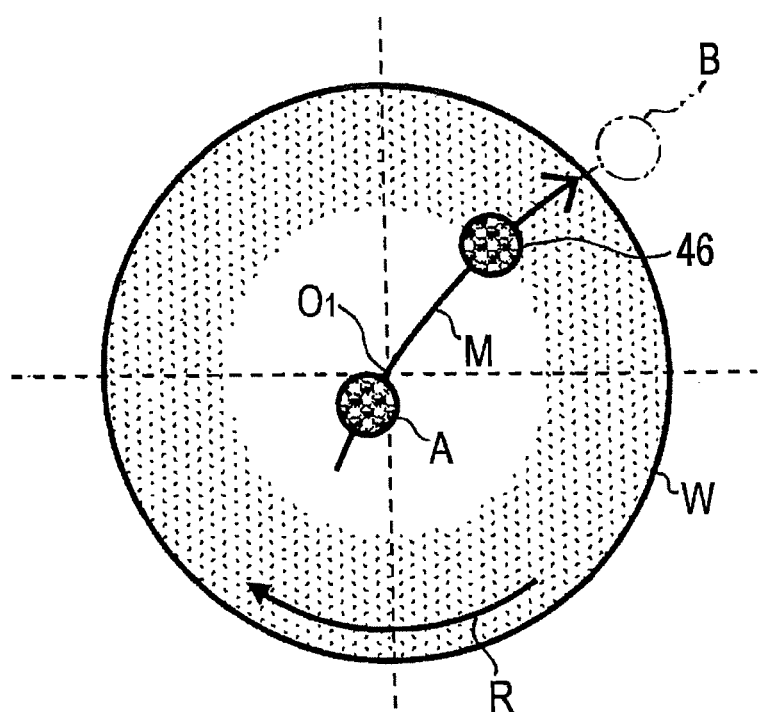
FIG. 7 is a plan view showing the relationship between the substrate, held by a substrate holding mechanism in the second cleaning unit shown in FIG. 6, and a two-fluid nozzle.
Figure 8:
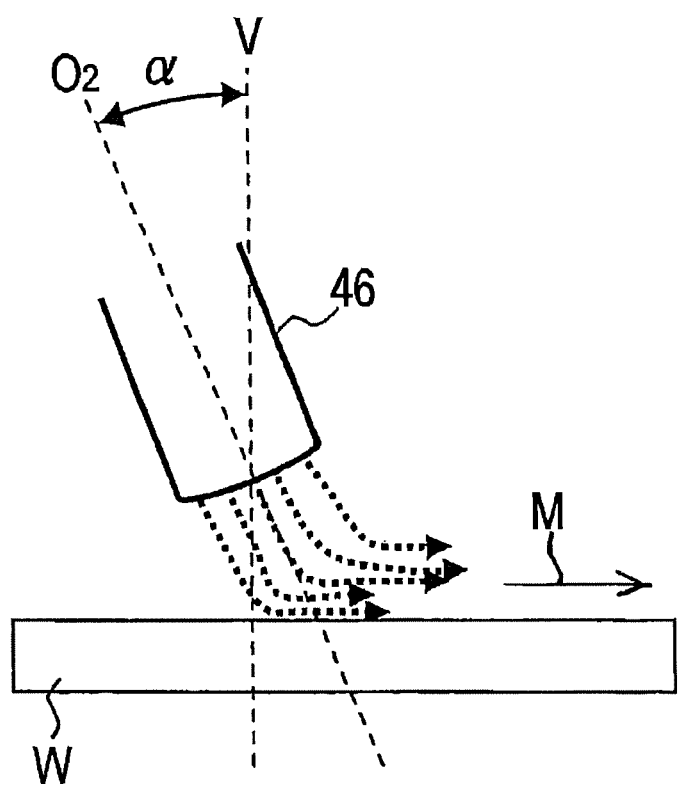
FIG. 8 is an elevational view showing the relationship between the substrate, held by the substrate holding mechanism in the second cleaning unit shown in FIG. 6, and the two-fluid nozzle.
Figure 9:
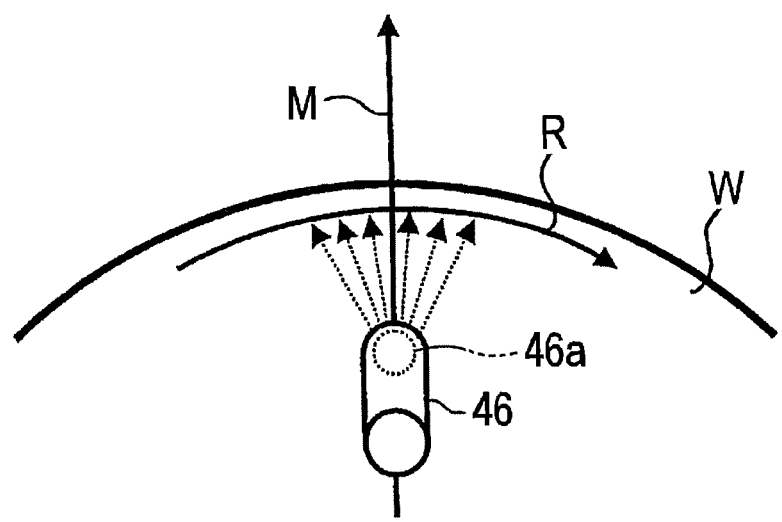
FIG. 9 is an enlarged plan view showing a main part of FIG. 7.
Figure 10:
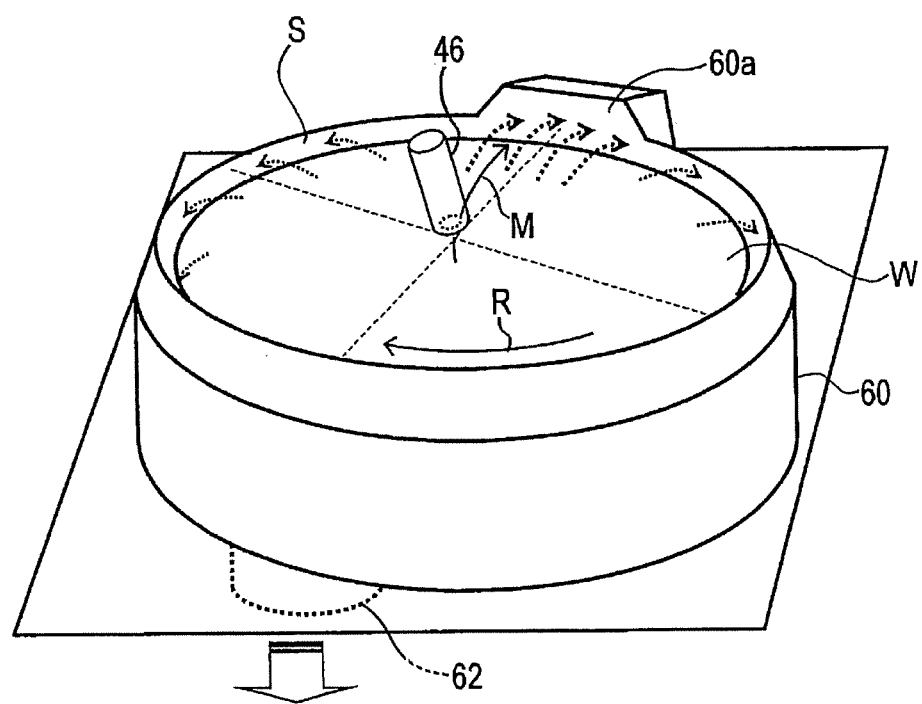
FIG. 10 is a schematic perspective view showing the substrate held by the substrate holding mechanism, the scatter-preventive cup for surrounding the periphery of the substrate, and the two-fluid nozzle.
Figure 11:
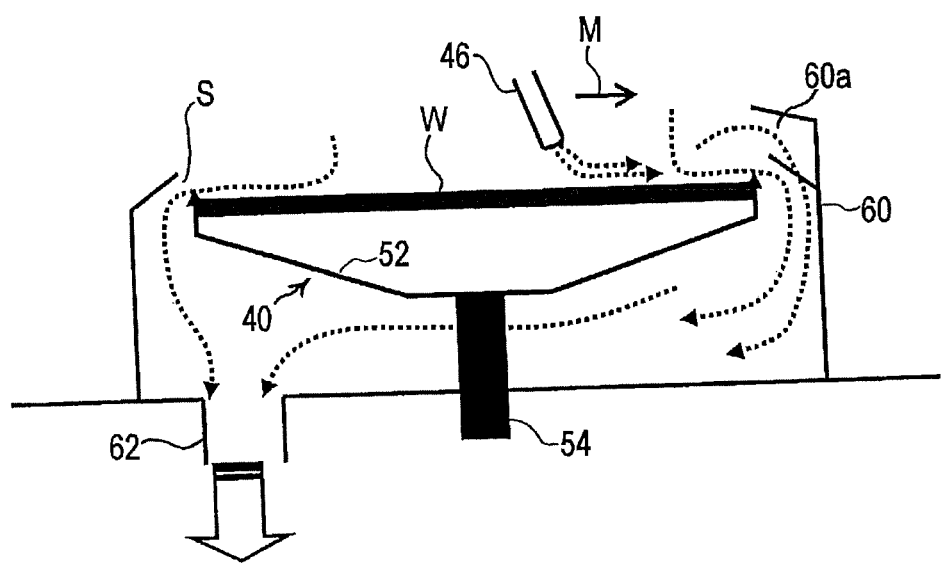
FIG. 11 is a schematic vertical cross-sectional view showing the second cleaning unit (substrate cleaning apparatus)

FIG. 6 is a schematic perspective view showing the substrate cleaning apparatus, according to an embodiment of the present invention, which is used as the second cleaning unit 18 shown in FIG. 5. In FIG. 6, illustration of a scatter-preventive cup is omitted. FIG. 7 is a plan view showing the relationship between the substrate, held by a substrate holding mechanism in the second cleaning unit 18 shown in FIG. 6, and a two-fluid nozzle. FIG. 8 is an elevational view showing also the relationship between the substrate and the two-fluid nozzle. FIG. 9 is an enlarged plan view showing a main part of FIG. 7. FIG. 10 is a schematic perspective view showing the substrate held by the substrate holding mechanism, the scatter-preventive cup for surrounding the periphery of the substrate, and the two-fluid nozzle. FIG. 11 is a schematic vertical cross-sectional view of the second cleaning unit (substrate cleaning apparatus) 18.

As shown in FIG. 6, the second cleaning unit 18, as the substrate cleaning apparatus according to the embodiment of the present invention, includes a substrate holding mechanism 40 for horizontally holding and rotating the substrate W, such as a semiconductor wafer, with its front surface facing upward, a rotatable support shaft 42 vertically provided laterally of the substrate W held by the substrate holding mechanism 40, and an oscillating arm 44 having a base portion coupled to an upper end of the support shaft 42 and extending in a horizontal direction. The oscillating arm 44 is located above the substrate W held by the substrate holding mechanism 40. The support shaft 42 and the oscillating arm 44 constitute a moving mechanism 48, which allows a two-fluid nozzle 46 to move in a direction parallel to the surface of the substrate W held by the substrate holding mechanism 40.

A substantially cylindrical two-fluid nozzle 46 having a circular ejection port 46a (see FIG. 9) is vertically movably mounted, with its front end facing downward, on a free end (distal end) of the oscillating arm 44. A carrier gas supply line (not shown) for supplying a carrier gas comprising an inert gas such as $N_2$ gas and argon gas, and a cleaning liquid supply line (not shown) for supplying a cleaning liquid, such as pure water, water containing dissolved $CO_2$ gas, or hydrogen water are connected to the two-fluid nozzle 46. A two-fluid jet flow in which the cleaning liquid is contained in a state of fine liquid droplets (mist) in the carrier gas is created by jetting a mixture of the carrier gas, such as $N_2$ gas, and the cleaning liquid, such as pure water or water containing dissolved $CO_2$ gas, supplied into the two-fluid nozzle 46, at a high speed from the ejection port 46a of the two-fluid nozzle 46. The two-fluid jet flow, created by the two-fluid nozzle 46, is jetted toward the surface of the rotating substrate W to collide with the surface of the substrate W, and thus particles and the like on the surface of the substrate can be removed (cleaned) by utilizing shock waves generated by the collision of the mist with the surface of the substrate.

The support shaft 42 is coupled to a motor (not shown), as a drive mechanism, for rotating the support shaft 42, thereby oscillating the oscillating arm 44 about the support shaft 42. A rotational speed and a rotation angle of the motor are controlled by signals from the control panel 30. Thus, an angular velocity and an oscillation angle of the oscillating arm 44 are controlled so that a moving velocity and a moving distance of the two-fluid nozzle 46 are controlled.

The substrate holding mechanism 40 has a plurality of (four as illustrated) arms 52 having respective distal ends on which chucks 50 are mounted to hold the substrate W in a horizontal state. A base end of each of the arms 52 is coupled to a base 56 which is rotatable together with a rotating shaft 54. With this configuration, the substrate W held by the chucks 50 of the substrate holding mechanism 40, with its front surface (polished surface) facing upward, is horizontally rotated in a rotational direction R.

FIG. 7 is a view showing a moving direction M, of two-fluid nozzle 46, depicted on the surface of the substrate W. The ejection port of the two-fluid nozzle 46 moves on a plane parallel to the surface of the substrate in such a state that the ejection port is spaced upwardly from the surface of the substrate by a predetermined distance. As shown in FIG. 7, the two-fluid nozzle 46 is moved by the oscillation of the oscillating arm 44 in one direction along the substantially straight moving direction M, from a cleaning start point A, which is spaced away from the center $O_1$ of the substrate W, through a point just above the center $O_1$ of the substrate W, to a cleaning finish point B which is outside of the periphery of the substrate W, and thus the surface of the substrate W is cleaned. At the time of the cleaning, the two-fluid jet flow in which the cleaning liquid is contained in a state of mist (fine liquid droplets) in the carrier gas, is jetted downwardly from the ejection port 46a of the two-fluid nozzle 46 toward the surface of the substrate W which is rotating horizontally.

As shown in FIG. 8 in detail, the two-fluid nozzle 46 is inclined so that an angle (inclined angle) between an ejection center line $O_2$ of the two-fluid jet flow and a vertical straight line V becomes α. The ejection port of the two-fluid nozzle is configured to be directed toward a forward side in the moving direction M of the two-fluid nozzle 46. By providing the two-fluid nozzle in this manner, the two-fluid jet flow jetted from the ejection port of the two-fluid nozzle 46 is arranged to collide with the surface of the substrate W at a position which is on the forward side of the moving direction M of the two-fluid nozzle 46. Here, the ejection center line of the two-fluid jet flow is substantially aligned with a center line, of the two-fluid nozzle, which passes through the center of the ejection port. The inclined angle α is larger than 0° and not more than 45° (0°<α≤45°), and preferably not less than 5° and not more than 45° (5°≤α≤45°).

With this configuration, as shown in FIGS. 8 and 9, the two-fluid jet flow which has been jetted from the ejection port 46a of the two-fluid nozzle 46 and has collided with the surface of the substrate and splashed back, mostly flows toward the outside of the substrate W along the moving direction M of the two-fluid nozzle 46. Accordingly, the mist and the particles contained in the two-fluid jet flow can be inhibited to be reattached onto an area, which has been cleaned, of the surface of the substrate W. Therefore, the two-fluid jet cleaning which has the inherent cleaning characteristics can be performed by inhibiting reattachment of the mist and the particles, contained in the two-fluid jet flow, onto the surface of the substrate W.

As shown in FIGS. 10 and 11, at a position which surrounds the periphery of the substrate W held by the substrate holding mechanism 40, there is provided a substantially cylindrical scatter-preventive cup 60 for preventing the two-fluid jet flow, which has collided with the surface of the substrate W and splashed back, from being scattered outside. Between the scatter-preventive cup 60 and the peripheral edge of the substrate W held by the substrate holding mechanism 40, a space S is provided along the entire periphery of the substrate W. The scatter-preventive cup 60 has a centralized exhaust port 60a, having a widened opening portion, at a forward position in the moving direction M of the two-fluid nozzle 46. A bottom end of the scatter-preventive cup 60 is connected to an exhaust duct 62.

With such configuration, the two-fluid jet flow, which has collided with the surface of the substrate W and splashed back, flows downwardly along an inner circumferential surface of the scatter-preventive cup 60, and is then exhausted outside through the exhaust duct 62. In this example, as described above, the two-fluid jet flow which has collided with the surface of the substrate W and splashed back, mostly flows toward the outside of the substrate W along the moving direction of the two-fluid nozzle 46, and the centralized exhaust port 60a having the widened opening portion is provided at a forward position in the flowing direction of the two-fluid jet flow. Therefore, the two-fluid jet flow, which has collided with the surface of the substrate W and splashed back and then flows toward the outside of the substrate W along the moving direction M of the two-fluid nozzle 46, is rapidly collected into the interior of the scatter-preventive cup 60 through the centralized exhaust port 60a, thereby exhausting the two-fluid jet flow to the outside.

Figure 12:
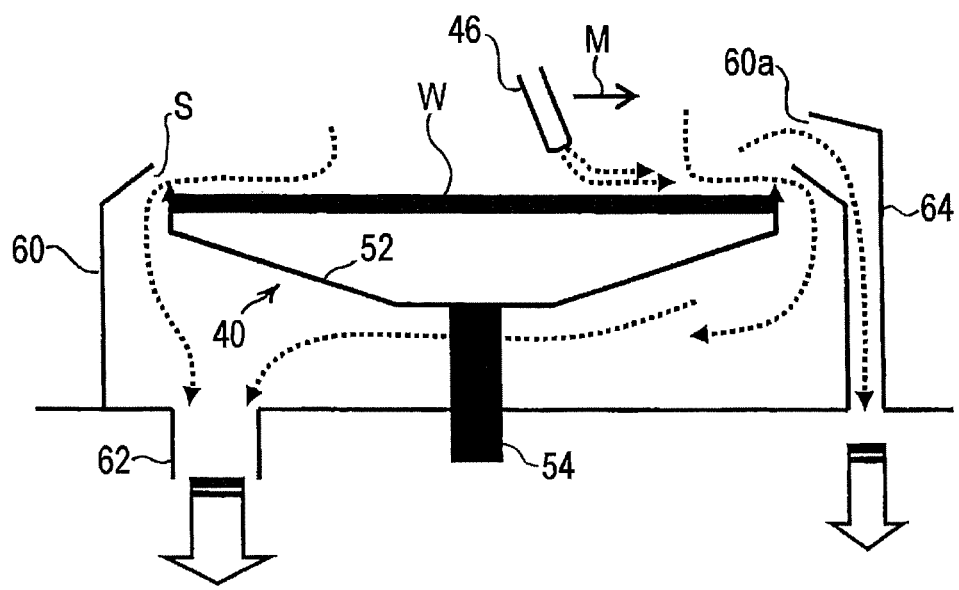
FIG. 12 is a schematic vertical cross-sectional view showing the second cleaning unit (substrate cleaning apparatus) having another scatter-preventive cup.

As shown in FIG. 12, the centralized exhaust port 60a of the scatter-preventive cup 60 may be connected directly to an exclusive exhaust duct 64 which is independent from the scatter-preventive cup 60. With this configuration, the exhaust having superior exhaust performance (volume of the exhaust, exhaust velocity) can be carried out, and thus a larger volume of the two-fluid jet flow can be exhausted to the outside from the exclusive exhaust duct 64.

Next, an example of cleaning process of the substrate W by the second cleaning unit 18 will be described. The substrate holding mechanism 40 holds the substrate W, with its front surface (polished surface) facing upward, by the chucks 50 in a horizontal state. After the substrate is held in a horizontal state by the substrate holding mechanism 40, the oscillating arm 44 is energized to move the two-fluid nozzle 46, which has been located at a retracted position laterally of the substrate holding mechanism 40, to the cleaning start point A spaced upwardly from the substrate W by a predetermined distance.

In this state, the substrate W is horizontally rotated in the rotational direction R, and the two-fluid jet flow in which the cleaning liquid is contained in the state of mist (fine liquid droplets) in the carrier gas, is jetted downwardly at a high speed from the ejection port 46a of the two-fluid nozzle 46 toward the surface of the substrate W, which is located below the two-fluid nozzle 46, to collide with the surface of the substrate W. At the same time, the two-fluid nozzle 46 is moved in one direction along the substantially straight moving direction M, from the cleaning start point A, through the point just above the center $O_1$ of the substrate W, to the cleaning finish point B which is outside of the periphery of the substrate W (see FIG. 7). Thus, particles and the like on the surface of the substrate W can be removed (cleaned) with shock waves generated by the collision of the mist with the surface of the substrate W.

In this example, while the two-fluid nozzle 46 is moved in one direction, the downward two-fluid jet flow, jetted from the two-fluid nozzle 46, is collided with the surface of the substrate W which is rotating horizontally with its front surface facing upward, thereby cleaning the entire surface of the substrate W. At the time of the cleaning, the two-fluid jet flow which has collided with the surface of the substrate W and splashed back, mostly flows toward the outside of the substrate W along the moving direction of the two-fluid nozzle 46, and is rapidly collected into the interior of the scatter-preventive cup 60 through the centralized exhaust port 60a, having the widened opening port and provided at the forward position in the flowing direction of the two-fluid jet flow, thereby exhausting the two-fluid jet flow to the outside.

Figure 13:
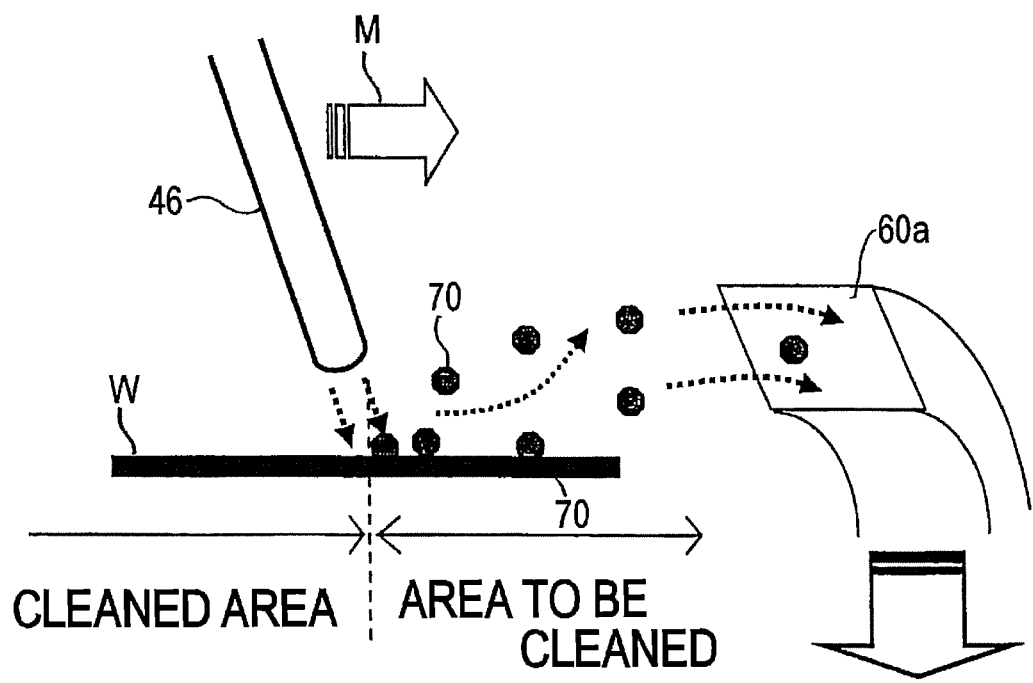
FIG. 13 is a view for explanation of particle behavior in a two-fluid jet cleaning according to an embodiment of the present invention.

FIG. 13 shows particle behavior at the time of the cleaning. As shown in FIG. 13, the particles 70 which have collided with the mist of the two-fluid jet flow at the time of the cleaning and have been removed from the surface of the substrate W, ride on a flow directed to the outside of the substrate W along the moving direction M of the two-fluid nozzle 46 and move toward the outside of the substrate W. Then, the particles 70 are collected into the interior of the scatter-preventive cup 60 through the centralized exhaust port 60a, without being attached onto the cleaned area of the surface of the substrate W, and exhausted to the outside. Therefore, the two-fluid jet cleaning having the inherent cleaning characteristics of the two-fluid nozzle can be performed without the necessity of considering the reattachment of the particles 70, which have been removed from the surface of the substrate W, onto the surface of the substrate W. Further, the entire area of the surface of the substrate W can be cleaned more uniformly, by cleaning the surface of the substrate W while moving the two-fluid nozzle 46, in such a state that the two-fluid nozzle 46 is spaced above the substrate W by a predetermined distance, from the cleaning start point A, through the point just above the center $O_1$ of the substrate W, to the cleaning finish point B which is outside of the periphery of the substrate W.

In the substrate processing apparatus shown in FIG. 5, the substrate taken out from a substrate cassette inside the loading port 12 is transferred to one of the polishing units 14a, 14b, 14c, 14d, and the surface of the substrate is polished by the specified polishing unit. The substrate which has been polished is transferred to the first cleaning unit 16 where the substrate is roughly cleaned, and is then transferred to the second cleaning unit (substrate cleaning apparatus) 18 where the substrate is finally cleaned. Then, the cleaned substrate is transferred to the drying unit 20 where the substrate is dried. Thereafter, the dried substrate is returned into the substrate cassette inside the loading port 12.

Figure 14:
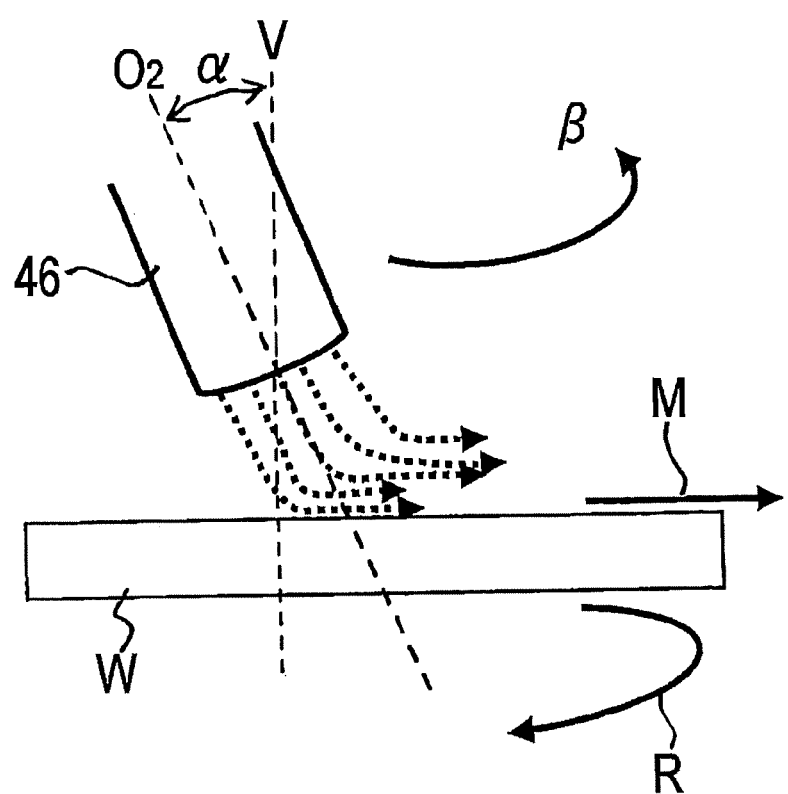
FIG. 14 is an elevational view showing the relationship between the two-fluid nozzle and the substrate held by the substrate holding mechanism in the substrate cleaning apparatus according to another embodiment of the present invention.
Figure 15:
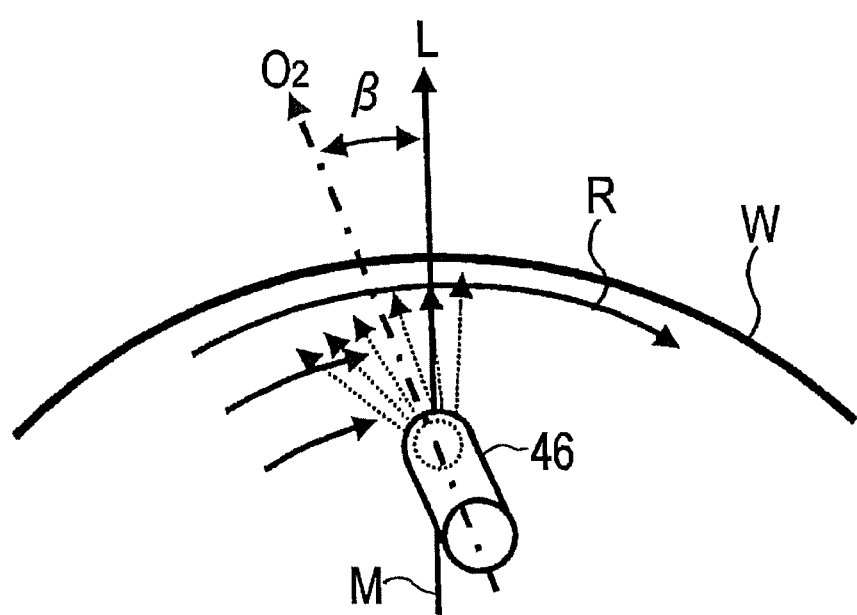
FIG. 15 is an enlarged plan view showing a part of FIG. 14.

FIGS. 14 and 15 show the relationship between the two-fluid nozzle 46 and the substrate held by the substrate holding mechanism (see FIG. 6) in the substrate cleaning apparatus according to another embodiment of the present invention. The another embodiment shown in FIGS. 14 and 15 differs from the above-described embodiment (see FIG. 9) in that the ejection port of the two-fluid nozzle 46 is not directed toward the moving direction of the two-fluid nozzle, but is directed toward an upstream side of the rotational direction of the substrate. Specifically, the two-fluid nozzle 46 is arranged so that the ejection port of the two-fluid nozzle 46 is directed toward the upstream side of the rotational direction of the substrate in such a manner that a line formed by vertically projecting the ejection center line $O_2$ of the two-fluid jet flow onto the substrate, intersects with a line formed by vertically projecting a straight line L, extending in the moving direction M of the two-fluid nozzle 46, onto the substrate at a predetermined angle β. By arranging the two-fluid nozzle 46 in this manner, the two-fluid jet flow jetted from the ejection port 46a collides with the surface of the substrate W at the upstream side of the rotational direction R of the substrate W with respect to the straight line L extending in the moving direction M of the two-fluid nozzle 46. In this example, as shown in FIGS. 14 and 15, the two-fluid nozzle 46 is arranged to be inclined toward the moving direction of the two-fluid nozzle at an inclined angle α, and a lower end side of the two-fluid nozzle, i.e. the ejection port side, is further twisted by the angle β toward the upstream side of the rotational direction R of the substrate W about an upper end side of the two-fluid nozzle, as a fulcrum. The twisted angle β is larger than 0° and not more than 30° (0°<β≤30°), and preferably not less than 5° and not more than 30° (5°≤β≤30°).

With this configuration, the relative velocity between the rotating substrate and the two-fluid jet flow when the two-fluid jet flow, jetted from the ejection port 46a of the two-fluid nozzle 46, collides with the surface of the substrate W is increased, and thus an impact force of the two-fluid jet flow applied to the surface of the substrate W is increased to obtain enhanced cleaning characteristics.

Figure 16:
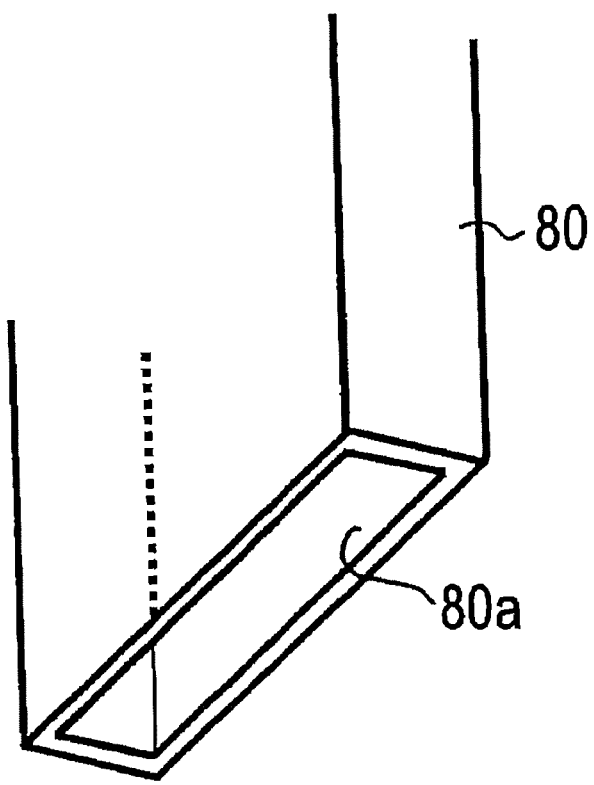
FIG. 16 is a perspective view showing another two-fluid nozzle.

FIG. 16 is a perspective view showing a two-fluid nozzle 80 having another shape. The two-fluid nozzle 80 having a rectangular tubular shape has an elongated rectangular ejection port 80a. The length of the long side of the ejection port 80a is preferably 1.4 or more times greater than that of the short side.

Figure 17:
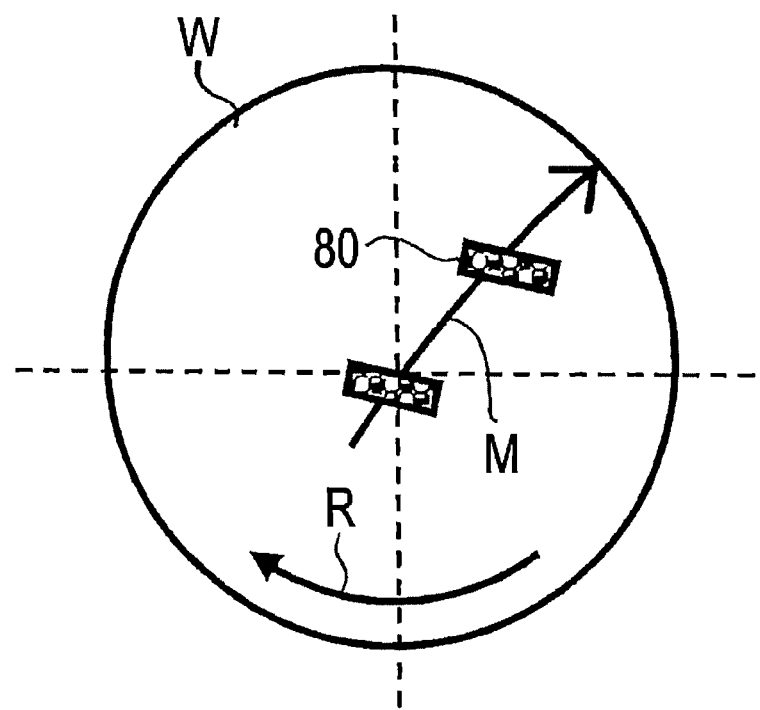
FIG. 17 is a plan view showing the relationship between the two-fluid nozzle shown in FIG. 16, and the substrate held by the substrate holding mechanism.
Figure 18:
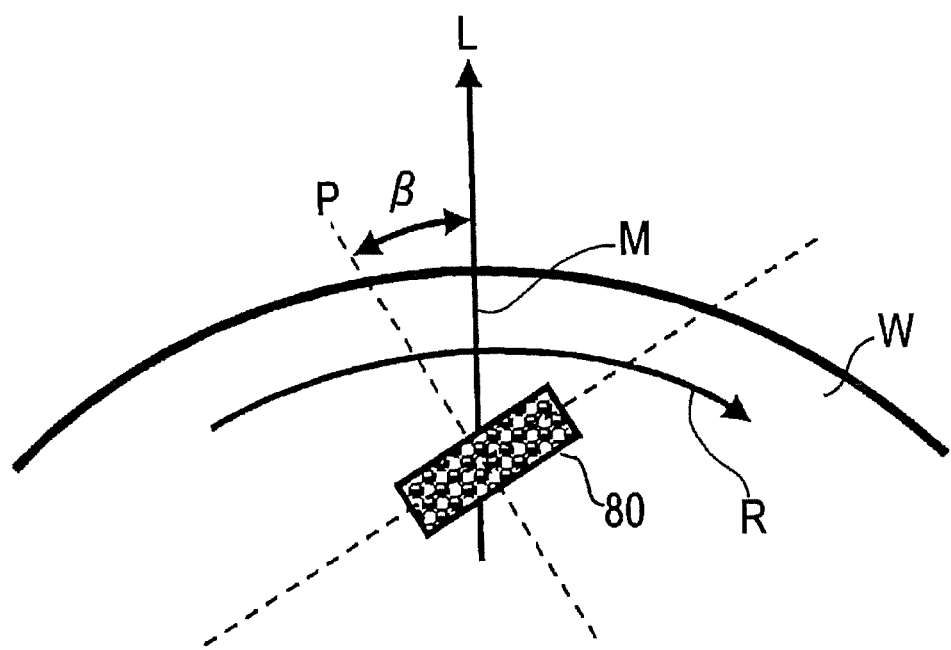
FIG. 18 is an enlarged plan view showing a part of FIG. 17.

In this example, as shown in FIGS. 17 and 18, the two-fluid nozzle 80 is arranged so that the long side of the ejection port 80a intersects with a straight line L extending in a moving direction M of the two-fluid nozzle 80, and the substrate is cleaned by the two-fluid nozzle 80. In the case where the direction of the two-fluid nozzle is twisted toward the upstream side of the rotational direction R of the substrate by an angle β, as shown in FIG. 18, the angle β is formed between a line P perpendicular to the long side of the ejection port 80a, and the straight line L extending in the moving direction M of the two-fluid nozzle 80. This holds true for a two-fluid nozzle 82 shown in FIG. 19 and a two-fluid nozzle 84 shown in FIG. 20.

As shown in FIGS. 16 through 18, because the substrate is cleaned by using the two-fluid nozzle having the elongated rectangular ejection port, a cleaning duration per a unit area of the surface of the substrate can be prolonged and the entire surface including the outer peripheral portion of the substrate can be cleaned more reliably while securing a large cleaning area, not by a nozzle having a complex structure such as multi-nozzles in which a plurality of nozzles are bundled together, but by one nozzle having a simple structure. Further, there is no fear that cleaning effects of respective nozzles are negated each other as in the case of using the multi-nozzles. Furthermore, cross-contamination, such as contamination of one nozzle caused by a two-fluid jet flow jetted from another nozzle, can be avoided.

Figure 19:
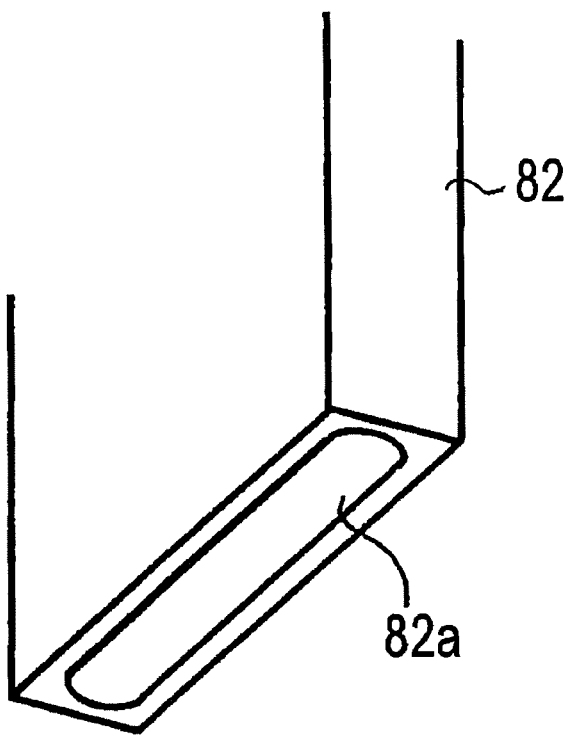
FIG. 19 is a perspective view showing still another two-fluid nozzle.
Figure 20:
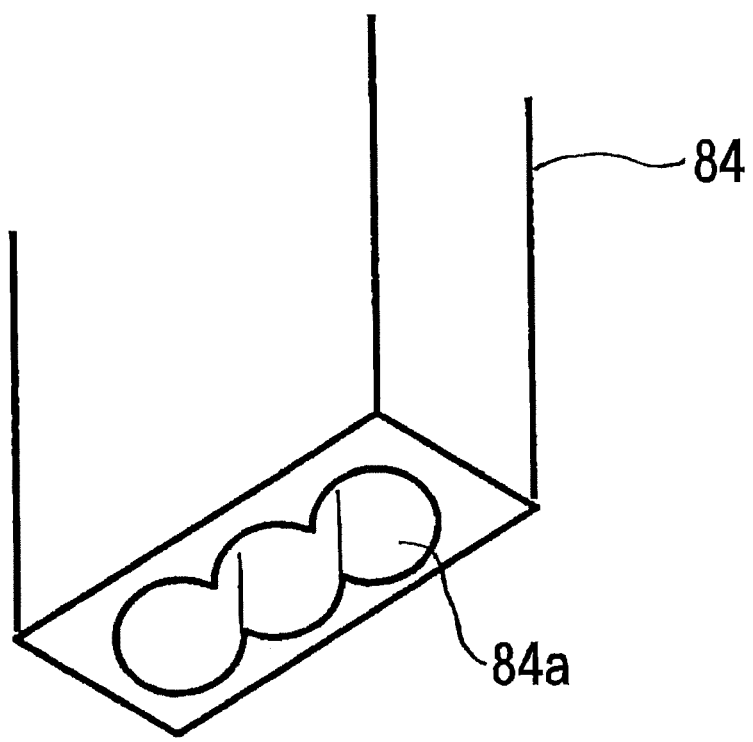
FIG. 20 is a perspective view showing still another two-fluid nozzle.

FIG. 19 is a perspective view showing still another two-fluid nozzle 82. The two-fluid nozzle 82 having a rectangular tubular shape has an elongated rectangular ejection port 82a having rounded corners on both ends of the ejection port 82a. FIG. 20 is a perspective view showing still another two-fluid nozzle 84. The two-fluid nozzle 84 having a rectangular tubular shape has an elongated ejection port 84a having such a shape that three circular nozzles are laterally connected to each other. In the cases where the two-fluid nozzle shown in FIG. 19 and the two-fluid nozzle shown in FIG. 20 are used, the same effect as that of the two-fluid nozzle shown in FIG. 16 can be obtained.

Although certain preferred embodiments of the present invention have been shown and described in detail, it should be understood that various changes and modifications may be made without departing from the scope of the appended claims.

What is claimed is:

1. A substrate cleaning apparatus for cleaning a substrate having a front surface and a reverse surface, said substrate cleaning apparatus comprising:
   arms with chucks at the ends configured to hold and rotate the substrate, with the front surface facing upward;
   a two-fluid nozzle configured to jet a two-fluid jet flow, comprising an inert gas and a cleaning liquid, downwardly toward the front surface of the substrate held by said arms with chucks at the ends; and
   a support shaft with an oscillating arm configured to move said two-fluid nozzle in one direction from a central portion toward a radially outer side of the substrate held by said arms with chucks at the ends;
   wherein said two-fluid nozzle is arranged to be inclined so that an angle between an ejection center line of the two-fluid jet flow jetted from said two-fluid nozzle and a vertical line becomes an inclined angle $\alpha$, and the two-fluid jet flow collides with the front surface of the substrate at a forward position in a moving direction of said two-fluid nozzle;
   wherein said two-fluid nozzle is further twisted so that a line formed by projecting said ejection center line of the two-fluid jet flow, jetted from said two-fluid nozzle, vertically onto the substrate intersects with a straight line formed directly under said two-fluid nozzle in said moving direction of said two-fluid nozzle, at a twisted angle $\beta$, wherein a lower end side of the two-fluid nozzle is twisted by the twisted angle $\beta$ about an upper end side of the two-fluid nozzle, as a fulcrum, toward the upstream side of a rotational direction of the substrate;
   wherein said two-fluid nozzle is moved by the oscillation of the oscillating arm, while keeping the inclined angle $\alpha$ and the twisted angle $\beta$, in one direction from a cleaning start point spaced away from the center of the substrate, through a point just above the center of the substrate, to a cleaning finish point positioned outside of the periphery of the substrate, so that an entire surface area of the substrate is cleaned.

2. The substrate cleaning apparatus according to claim 1, wherein said inclined angle $\alpha$ is not less than 5° and not more than 45°.

3. The substrate cleaning apparatus according to claim 1, wherein said angle $\beta$ is not less than 5° and not more than 30°.

4. The substrate cleaning apparatus according to claim 1, wherein said two-fluid nozzle has an ejection port having an elongated rectangular shape.

5. The substrate cleaning apparatus according to claim 1, further comprising:
   a scatter-preventive cup configured to surround a periphery of the substrate held by said arms and chucks at the ends;
   wherein said scatter-preventive cup has an exhaust port, having a widened opening portion, at a forward position in said moving direction of said two-fluid nozzle.

6. The substrate cleaning apparatus according to claim 5, wherein said exhaust port is connected to an exclusive exhaust duct.

7. The substrate cleaning apparatus according to claim 1, wherein said two-fluid nozzle has an ejection port having a circular shape.

8. The substrate cleaning apparatus according to claim 1, wherein said two-fluid nozzle is connected to a carrier gas supply line configured to supply an inert gas selected from $N_2$ gas and argon gas, and a cleaning liquid supply line configured to supply a cleaning liquid selected from pure water and water containing dissolved $CO_2$ gas.

9. The substrate cleaning apparatus according to claim 1, further comprising a control panel configured to control an angular velocity and an oscillation angle of the oscillating arm.

10. The substrate cleaning apparatus according to claim 1, wherein said arms with chucks at the ends are configured to horizontally hold and rotate the substrate.

11. A substrate processing apparatus, comprising:
    a polishing unit;
    a first cleaning unit configured to clean the substrate;
    a second cleaning unit configured to clean the substrate transferred from the first cleaning unit by a second transfer robot, wherein the second cleaning unit is the substrate cleaning apparatus according to claim 1; and
    a spin drying unit in which an IPA gas is ejected toward the substrate.

* * * * *